United States Patent [19]

Gubitose et al.

[11] 4,360,499

[45] Nov. 23, 1982

[54] BELLOWS ASSEMBLY FOR CRYSTAL RIBBON PULLER

[75] Inventors: Nicholas F. Gubitose, Moosic; Malcolm R. Schuler, Mountaintop, both of Pa.; David L. Patterson, Wall, N.J.

[73] Assignee: RCA Corporation, New York, N.Y.

[21] Appl. No.: 275,606

[22] Filed: Jun. 22, 1981

[51] Int. Cl.³ .............................................. C30B 15/34
[52] U.S. Cl. ............................. 422/246; 156/DIG. 93
[58] Field of Search ............................. 422/246, 249; 156/DIG. 93, 608, 617 SP, 617 M, 617 R; 29/454

[56] References Cited

U.S. PATENT DOCUMENTS

| 992,581 | 5/1911 | Noonan et al. | 29/454 |
| 2,300,547 | 11/1942 | Guarnaschelli | 29/454 |
| 2,657,075 | 10/1953 | Schwester et al. | 29/454 |
| 3,151,695 | 10/1964 | Mintz | 156/DIG. 93 |
| 3,173,765 | 3/1965 | Gobat et al. | 422/249 |
| 3,558,281 | 1/1971 | Dyer | 156/DIG. 93 |
| 3,679,370 | 7/1972 | Czeck et al. | 422/249 |
| 3,800,398 | 4/1974 | Harrington, Jr. | 29/454 |
| 3,953,281 | 4/1976 | Pantusco et al. | 422/249 |
| 4,045,181 | 8/1977 | Burd et al. | 422/249 |
| 4,075,055 | 2/1978 | Ciszek et al. | 156/DIG. 93 |

Primary Examiner—Hiram Bernstein
Attorney, Agent, or Firm—Birgit E. Morris; Donald S. Cohen; Robert P. Seitter

[57] ABSTRACT

There is disclosed apparatus for growing a ribbon of crystalline material which apparatus comprises a furnace adapted to contain a melt from which the ribbon is to be grown and crystal pulling means spaced from the furnace and including crystal seed holding means and sliding means moving said crystal seed holding means toward and away from the furnace. Extending between the furnace and the crystal seed pulling means are inner and outer bellows means spaced apart from each other to define a space therebetween. This space may be purged with an inert gas when pulling crystal.

6 Claims, 2 Drawing Figures

BELLOWS ASSEMBLY FOR CRYSTAL RIBBON PULLER

BACKGROUND OF THE INVENTION

This invention relates to apparatus for forming a crystalline ribbon and, more particularly, to a bellows arrangement used with such apparatus.

A particular technique for growing crystalline ribbons from a pool of liquid, commonly referred to as a melt, is the EFG technique (Edge-defined Film-fed Growth). In carrying out an EFG technique, there is provided a furnace containing heating means and a crucible in which raw material is heated to form the melt. The crucible, in turn, contains a die including a capillary passage formed with growth control surfaces at its upper edge. The melt flows up the capillary and rests on the growth control surfaces. This furnace is airtight and usually purged with an inert gas such as argon so that there is no contaminating moisture or gases therein. Such contaminants can cause the formation of unacceptable microvoids in the ribbon. There is also provided a seed crystal carried by slider means which is lowered into contact with the melt at the top of the growth control surfaces whereupon, because of the temperature gradient between the liquid and the seed, a crystalline ribbon is epitaxially grown on the seed as a continuation thereof. By pulling the seed away from the growth control surfaces at an appropriate rate, an elongated ribbon is formed.

Ribbons up to 7 feet (approximately 213 cm) in length have been grown with this technique. To accommodate the ribbon, it is usual to provide an airtight bellows between the furnace and the slider means so that contaminating moisture and gases do not enter the growing chamber of the furnace. However, the bellows may contain fine pores and/or small puncture openings that allow contaminants to enter the interior thereof and flow to the growth chamber of the furnace. When this happens, the unacceptable microvoids can be formed in the ribbon. Moreover, a lint type material collects in the growth chamber of the furnace requiring its frequent disassembly and cleaning.

SUMMARY OF THE INVENTION

This invention provides a bellows arrangement that prevents contaminant gases from entering the system. Thus, between the furnace and the crystal pulling assembly there is provided inner and outer bellows arranged such that the outer bellows surrounds the inner bellows and is spaced therefrom. If desired, the space between the bellows can be purged with an inert gas.

BRIEF DESCRIPTION OF THE DRAWING

For a better understanding of the invention, reference is made to the following description of a preferred embodiment thereof, taken in conjunction with the figures of the accompanying drawing, in which.

DETAILED DESCRIPTION OF A PREFERRED EMBODIMENT

Figure 1:
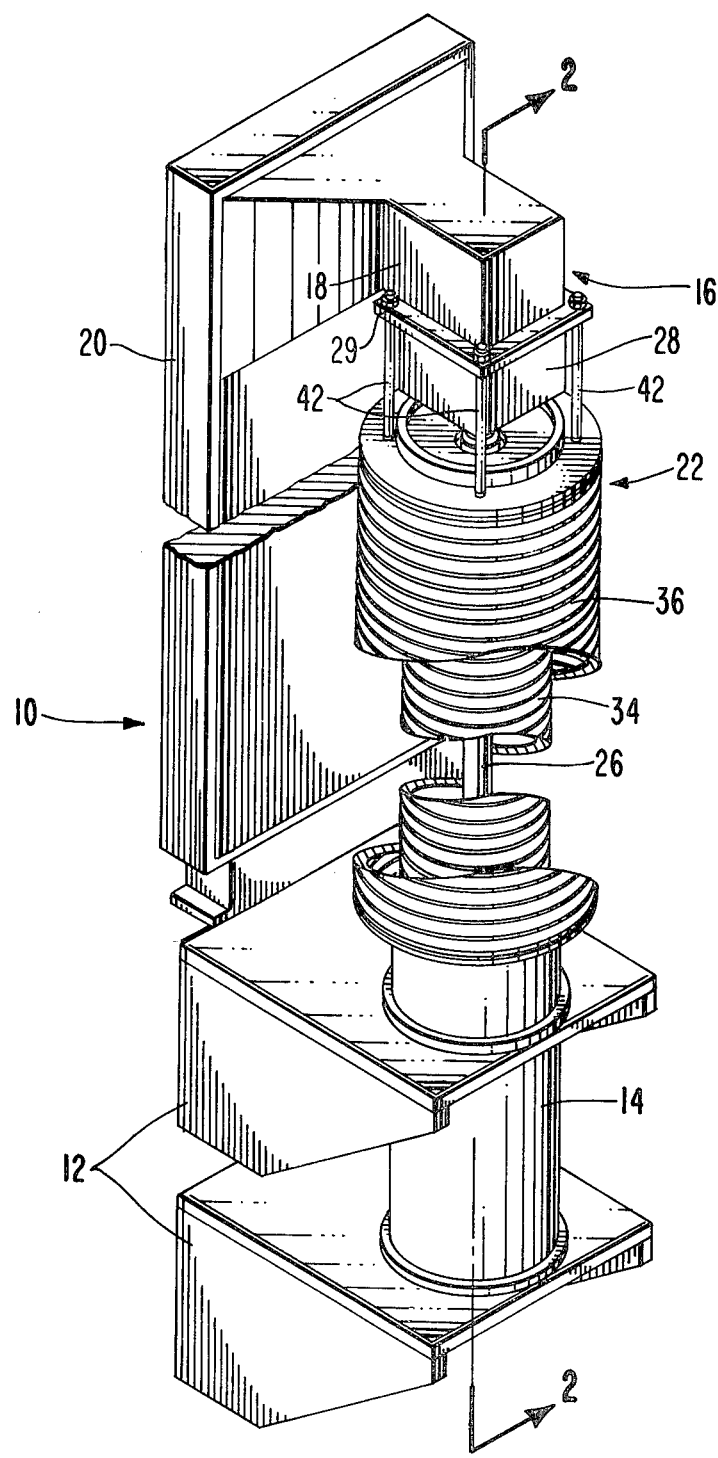
FIG. 1 is a perspective view illustrating the main components of a crystal growing apparatus for carrying out an EFG technique.

In FIG. 1 there is illustrated the basic parts of a crystal ribbon puller 10 that carries out an EFG technique as described above. Included is a support member 12 on which is carried a furnace 14 including a crucible, RF heating coil and a capillary die. The furnace 14 is preferably of a type disclosed in copending application Ser. No. 18,040, filed Mar. 6, 1979 now U.S. Pat. No. 4,271,129, June 2, 1981. This copending application, entitled HEAT RADIATION DEFLECTORS WITHIN AN EFG CRUCIBLE and filed in the name of Samuel Berkman et al., is assigned to the assignee of this application. Also included in the apparatus 10 is a crystal pulling means 16 including a crystal seed holding means and a slider head 18 which is slidably mounted in a track 20 extending vertically away from the furnace 14 and which is connected to a drive means (not shown) for moving the crystal seed holding means toward and away from the furnace. Extending between the furnace 14 and the crystal pulling means 16 is a bellows arrangement 22 in accordance with this invention. The crystal seed holding means is enclosed by the bellows means which expands and contracts with movement of the slider head 18.

Initially, the bellows arrangement 22 is collapsed and the slider head 18 is at the bottom of the track 20 adjacent to the furnace 14 so that the crystal seed is adjacent the die in the furnace. As the ribbon is grown, the slider head 18 moves away from the furnace 14 toward the top of the track 20 pulling the ribbon away from the die and expanding the bellows arrangement 22.

Figure 2:
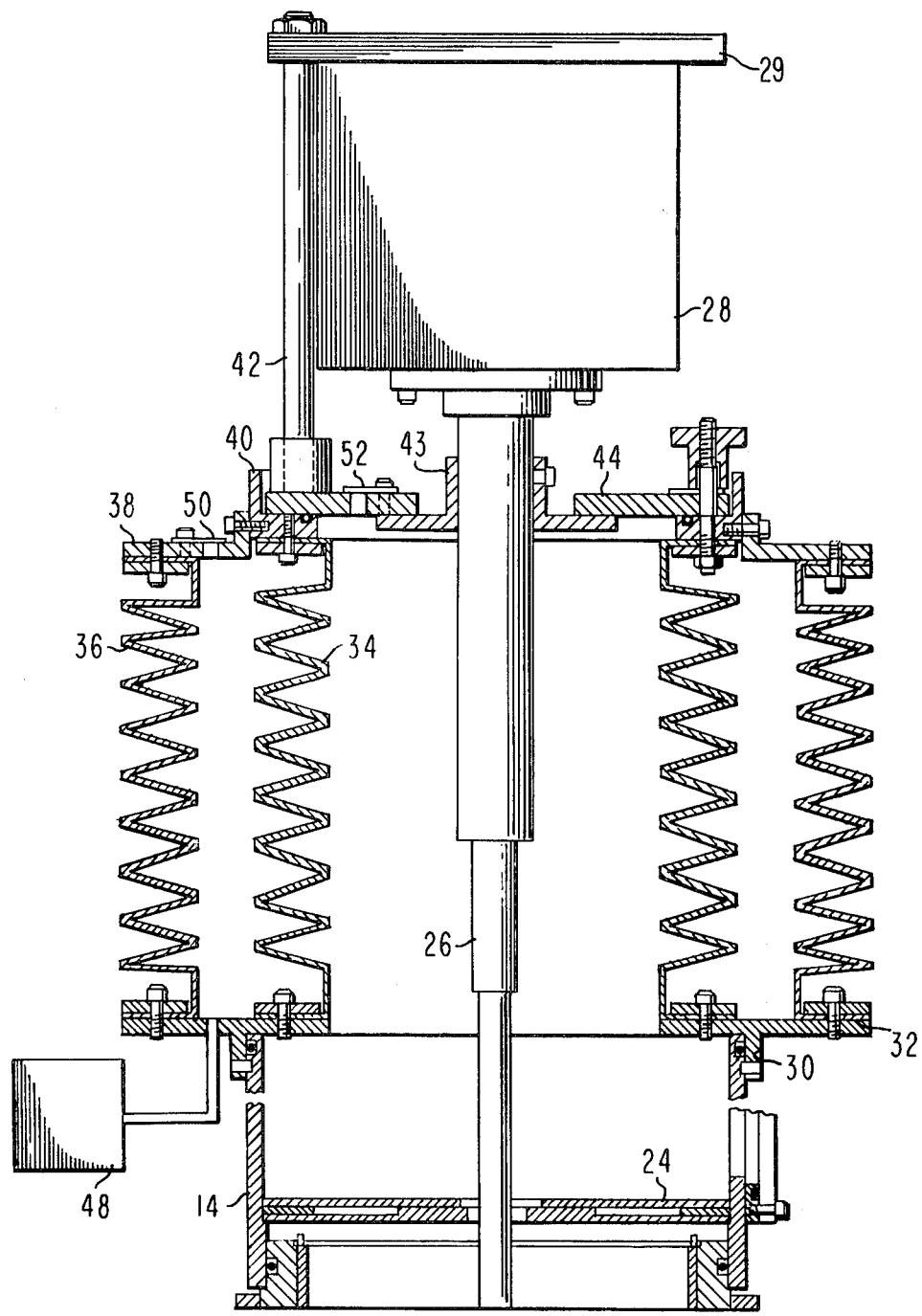
FIG. 2 is a longitudinal section view of a bellows arrangement usable with the crystal pulling apparatus illustrated in FIG. 1.

Referring now to FIG. 2, adjacent the top of furnace 14 there is a plate 24 formed with an opening through which a rod 26, forming part of the crystal seed holding means, extends. The lower end of the rod 26 carries a crystal seed and is formed in accordance with the disclosure in our copending application Ser. No. 242,046, filed on March 9, 1981 for CRYSTAL SEED HOLDER ASSEMBLY. This copending applicaton is also assigned to the assignee of this application. The upper end of the rod 26 is secured to adjusting means 28 operative to adjust the position of the crystal seed relative to the die. Conventionally, such adjusting means includes an X and a Y coordinate adjusting device and an angular adjusting device. The adjusting means 28 is mounted to a plate 29 on the bottom of the slider head 18.

At the top of the furnace 14 is a mounting collar 30 formed with a radial flange 32 extending inwardly and outwardly of the furnace wall. Suitable sealing means are provided between the collar 30 and the furnace wall to which it is secured. Secured in sealing engagement to the flange 32, are an inner bellows 34 and an outer bellows 36. The bellows 34 and 36 are generally concentric and spaced apart from each other to define a space therebetween. Preferably, each bellows 34 and 36 is made of a non-porous material such as butyl rubber, which is impermeable to gases.

At their upper ends, the bellows 34 and 36 are mounted so that their weight is supported by the slider head 18. This is accomplished by providing an annular mounting ring 38 which is secured to another annular mounting ring 40 that cooperates with a plurality of threaded studs 42 secured at their upper ends to the slider head 18. The outer bellows 36 is secured at its top end to the ring 38 and the inner bellows 34 is similarly secured to the ring 40. Thus, all of the weight of the bellows assembly is suspended from the massive slider head in contrast to the prior art technique of mounting the single bellows to the adjusting means 28. If the double bellows arrangement is made of butyl rubber, its weight can be substantial and it would not be adequately supported by the adjusting means 28. Moreover, if the bellows is expanded and sways for any reason, the adjusting means 28 could be knocked out of alignment causing the ribbon to pivot about the interface of the crystal seed with the melt. Even the slightest such movement can cause the entire ribbon to fracture or break. As an additional advantage, the adjustment to the seed rod holder through the adjusting means 28 is facilitated inasmuch as its movement is not resisted by the weight of the bellows.

The space between the inner bellows 34 and the seed rod 26 is also sealed adjacent the upper end of the bellows. This is accomplished by mounting a collar 43 to the seed rod 26 adjacent the adjusting means 28. The collar 43 includes a radial flange to which is secured an annular disk 44. The disk 44 extends between the flange of the collar 43 and the radial flange on the mounting ring 40. With the collar 43, disk 44 and ring 40 thus secured, they effectively seal the upper edge of the space between the inner bellows and the seed rod.

In order to guard against the entry of contaminating atmospheric gases to the sealed chamber in which the crystal ribbon is grown, the space between the inner and outer bellows 34 and 36 is purged with an inert gas such as argon. To accomplish this, the lower mounting flange is formed with suitable fittings which are connected to a source of inert gas 48. Thus, the inert gas is admitted into the space providing an inert atmosphere and this gas is discharged through a suitable flapper valve 50 formed in the mounting ring 38. Use of the flapper valve is preferred over other pressure relief valve arrangements because it is not as prone to failure. Failure of a pressure relief valve to open could have catastrophic consequences in that the pressurized space could cause the inner bellows 34 to expand radially inwardly and damage the crystal ribbon. In practice, the flapper valve 50 can be formed by a suitable flexible material placed over holes in the mounting ring 38. Any contaminants that inadvertently flow into the space between the bellows 34 and 36 are carried away by the inert gas flowing through the flapper valve 50. Thus, these contaminants will not flow into the space between the inner bellows 34 and the seed rod 26 and contaminate the environment in which the ribbon is grown.

Similarly, the chamber formed inside the inner bellows 34 is purged with an inert gas to minimize contaminants. The source of this gas is not illustrated in the drawing. To vent this chamber and prevent radially outward expansion of the bellows 34, the disk 44 carries a flapper valve 52 similar to flapper valve 50.

While in the foregoing there has been described a preferred embodiment of the invention, it should be obvious to those skilled in the art that various changes and modifications can be made without departing from the true spirit and scope of the invention as recited in the appended claims.

We claim:

1. Apparatus for growing a ribbon of crystalline material, said apparatus comprising a furnace adapted to contain a melt from which the ribbon is to be grown, crystal pulling means spaced from said furnace, said crystal pulling means including a crystal seed holding means and sliding means on which said crystal seed holding means is carried for moving said crystal seed toward and away from said furnace, inner and outer bellows means extending between and being sealed to said furnace and said crystal pulling means such that both bellows means expand and contract in response to motion of said crystal pulling means, said outer bellows means surrounding said inner bellows means and being spaced therefrom, gas inlet means communicating with the space between said first and second bellows means and gas outlet means also communicating with said space.

2. Apparatus in accordance with claim 2 wherein said gas outlet means includes flapper valve means.

3. Apparatus in accordance with claims 1 or 2 wherein said gas inlet means is connected to a source of inert gas.

4. Apparatus in accordance with claim 1 wherein said first and second bellows means are connected at one end to said sliding means.

5. Apparatus in accordance with claim 1 wherein said first and second bellows means are made of non-porous material.

6. Apparatus in accordance with claim 5 wherein said non-porous material is butyl rubber.

* * * * *

UNITED STATES PATENT AND TRADEMARK OFFICE
CERTIFICATE OF CORRECTION

PATENT NO. : 4,360,499

DATED : November 23, 1982

INVENTOR(S) : Nicholas F. Gubitose et al.

It is certified that error appears in the above-identified patent and that said Letters Patent is hereby corrected as shown below:

CLAIM 2

Column 4, line 34: "2" should be --1--.

Signed and Sealed this

Twelfth Day of April 1983

[SEAL]

Attest:

Attesting Officer

GERALD J. MOSSINGHOFF

Commissioner of Patents and Trademarks